United States Patent
Kapoor et al.

(10) Patent No.: US 10,158,292 B2
(45) Date of Patent: Dec. 18, 2018

(54) POWER CONFIGURATION

(71) Applicant: NXP B.V., Eindhoven (NL)

(72) Inventors: Ajay Kapoor, Eindhoven (NL); Steven Mark Thoen, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/412,727

(22) Filed: Jan. 23, 2017

(65) Prior Publication Data

US 2018/0212519 A1 Jul. 26, 2018

(51) Int. Cl.
*G05F 3/02* (2006.01)
*H02M 3/158* (2006.01)
*G11C 5/14* (2006.01)
*H02M 1/00* (2006.01)

(52) U.S. Cl.
CPC ............ *H02M 3/158* (2013.01); *G11C 5/143* (2013.01); *G11C 5/148* (2013.01); *H02M 2001/0032* (2013.01); *H02M 2001/0077* (2013.01)

(58) Field of Classification Search
CPC ... G05F 1/46; H01L 2924/0002; H03K 17/18; H03K 17/145; H03K 2217/0036
USPC ...... 363/18–20, 21.07, 21.12, 21.15, 49, 59, 363/89; 327/536, 538, 540; 307/80, 81, 307/82
See application file for complete search history.

(56) References Cited

U.S. PATENT DOCUMENTS

| | | | |
|---|---|---|---|
| 5,828,620 A * | 10/1998 | Foss | G05F 3/205 365/226 |
| 5,867,040 A | 2/1999 | Fuse et al. | |
| 6,479,974 B2 * | 11/2002 | Cohn | H01L 23/5286 257/E23.153 |
| 6,600,679 B2 | 7/2003 | Tanzawa et al. | |
| 6,665,806 B1 * | 12/2003 | Shimizu | G06F 1/263 365/227 |
| 7,002,371 B2 | 2/2006 | Kase et al. | |
| 7,329,968 B2 * | 2/2008 | Shepard | H02J 1/08 307/18 |
| 7,605,609 B1 * | 10/2009 | Andrews | H03K 3/356165 326/63 |

(Continued)

FOREIGN PATENT DOCUMENTS

EP  2953004 A1  12/2015
EP  3 128 426 A2  2/2017

OTHER PUBLICATIONS

Kristof Blutman, "A Low Power System-on-Chip with Memory Stacked on Top of Logic", Msc. Thesis (Oct. 2014) (Abstract only).

(Continued)

*Primary Examiner* — Rajnikant Patel (57) ABSTRACT

As may be consistent with one or more embodiments, an apparatus and or method involves a switching power supply circuit and a control circuit therefor. The switching power supply circuit operates in high and low-power modes. In the high power mode, high and low power rails of a first circuit and of a second circuit are coupled to a power source circuit (e.g. a battery). In the low-power mode, the first circuit is operated in a high power domain and the second circuit is operated in a low power domain using recycled charge from the high power domain. The control circuit operates the switching circuit in the high-power mode and low-power mode (for power conservation) in response to a control signal.

20 Claims, 8 Drawing Sheets

(56) References Cited

U.S. PATENT DOCUMENTS

| | | | |
|---|---|---|---|
| 7,714,660 B2* | 5/2010 | Lesso | H02M 3/07 330/127 |
| 8,143,748 B2* | 3/2012 | Ochi | H02M 3/156 307/115 |
| 8,169,257 B2 | 5/2012 | Pelley | |
| 8,476,962 B2 | 7/2013 | Pelley | |
| 8,687,384 B2* | 4/2014 | Chen | H02M 3/33523 363/19 |
| 8,826,055 B2* | 9/2014 | Lee | G06F 1/3203 713/324 |
| 8,878,387 B1 | 11/2014 | Wong et al. | |
| 8,947,149 B1 | 2/2015 | Kapoor et al. | |
| 9,052,892 B2 | 6/2015 | Ristic et al. | |
| 9,214,865 B2* | 12/2015 | Levesque | H02M 3/1584 |
| 9,473,019 B2* | 10/2016 | Ripley | H02M 3/06 |
| 9,912,335 B2 | 3/2018 | Kapoor et al. | |
| 9,917,588 B2 | 3/2018 | Blutman et al. | |
| 2006/0119390 A1 | 6/2006 | Sutardja | |
| 2008/0265857 A1* | 10/2008 | Tabaian | H02M 1/08 323/288 |
| 2010/0259299 A1 | 10/2010 | Dennard et al. | |
| 2012/0256656 A1 | 6/2012 | Stirk et al. | |
| 2014/0340142 A1 | 11/2014 | Wong et al. | |
| 2015/0346742 A1 | 12/2015 | Kapoor et al. | |

OTHER PUBLICATIONS

Fuks, Adam; "Sensor-Hub Sweet-Spot Analysis for Ultra-Low-Power Alwayson Operation"; Symposium on VLSI Circuits, Kyoto, JP; IEEE Explore; 2 pages (Sep. 3, 2015).

* cited by examiner

| Step | Description | Signals | | | | | | | | |
|---|---|---|---|---|---|---|---|---|---|---|
| | | Flat | Flat | Stack | Stack | I1 | I2 | I3 | I4 | SRAM rails |
| 0 | Initially | VDD | 0 | VDD | VDDH | T | T | T | T | V1=VDD, V2=0V |
| 1 | Enable destination isolation clamps | VDD | 0 | VDD | VDDH | T | L/H | L/H | T | V1=VDD, V2=0V |
| 2 | Enable source isolation/clamps | VDD | 0 | VDD | VDDH | H | L/H | L/H | L | V1=VDD, V2=0V |
| 3 | LDO control. Scale the voltage of VDD and VDDH domains (equal power rails and level ~0.75V) | VDD | 0 | VDD | VDDH | H | L/H | L/H | L | V1=VDD, V2=0V |
| 4 | Disconnect VDD rails | 0 | VDDH | VDD | VDDH | H | L/H | L/H | L | V1,V2 floating |
| 5 | Connect VDDH rails | 0 | VDDH | 0 | VDD | H | L/H | L/H | L | V1=VDDH, V2=VDD |
| 6 | Adjust VDD rails, further, if needed | 0 | VDDHmin | 0 | VDDmin | H | L/H | L/H | L | V1=VDDHmin, V2=VDDmin |

Isolation cells: T: transparent,
L: o/p clamped to low,
H: o/p clamped to high

FIG. 4

| Steps | Description | Flat | Flat | Stack | Stack | Signals | | | | SRAM rails |
|---|---|---|---|---|---|---|---|---|---|---|
| | | | | | | I1 | I2 | I3 | I4 | |
| 0 | Initially | 0 | VDDH min | 0 | VDDmin | H | L/H | L/H | L | V1=VDDHmin, V2=VDDmin |
| 1 | Adjust VDD rails, if needed | 0 | VDDH | 0 | VDD | H | L/H | L/H | L | V1=VDDH, V2=VDD |
| 2 | Disconnect VDDH rails | 0 | VDDH | VDD | VDD | H | L/H | L/H | L | V1,V2 floating |
| 3 | Connect VDD rails | VDD | 0 | VDD | VDDH | H | L/H | L/H | L | V1=VDD, V2=0V |
| 4 | Disable source isolation clamps | VDD | 0 | VDD | VDDH | H | L/H | L/H | L | V1=VDD, V2=0V |
| 5 | Disable destination isolation clamps | VDD | 0 | VDD | VDDH | T | T | T | T | V1=VDD, V2=0V |
| 6 | LDO control: Scale the voltage of VDD and VDDH domains (VDD level~1V) | VDD | 0 | VDD | VDDH | T | T | T | T | V1=VDD, V2=0V |

Isolation cells: T transparent,
L: o/p clamped to low,
H: o/p clamped to high

POWER CONFIGURATION

OVERVIEW

Aspects of various embodiments are directed to the use of respective circuits operable over common/flat and recycled/stacked voltage levels.

Various approaches are implemented for operating circuitry on stacked arrangements in which voltage levels in respectively stacked circuits are drawn from the voltage level of adjacent circuits. This approach can be referred to as recycling voltage, such as via using a low voltage level provided from a first circuit, as a high voltage level for a subsequent circuit in a stack. Each circuit operates in a different power domain under different voltage ranges (e.g., between voltage rails at different voltage levels).

While useful, many circuits operating on the same or different voltage levels are susceptible to undesirable drawbacks. Flat circuits may require higher power, which can be undesirable for low-power modes such as standby modes. Stacked circuits can require additional configuration for communications between circuits, and may suffer from slow operation and may not be amenable to use with certain power supplies that do not provide a sufficiently high voltage level (e.g., greater than the sum of voltages of individual domains). Further, stack-based circuits may require balancing between different parts of stacked elements (e.g., top and bottom parts). This balancing may require careful timing closure and associated infrastructure (e.g., digital libraries), as well as level shifting between stacked elements that may require level shifters that are relatively large in comparison to a standard logic cell, prone to reliability and latch-up, and consume power.

These and other matters have presented challenges to power savings and operability of circuitry, for a variety of applications.

SUMMARY

Various example embodiments are directed to issues such as those addressed above and/or others which may become apparent from the following disclosure, and including issues concerning power consumption.

As may be implemented with one or more embodiments, an apparatus and/or method involves a switching power supply circuit and control (such as a control circuit) therefor. The switching power supply circuit operates in high and low-power modes. In the high power mode, high and low power rails of respective circuits are coupled to a power source circuit. In the low-power mode, the circuits are operated respectively in a high power domain and a low power domain, the latter of which uses recycled charge from the high power domain. The switching circuit is switched between the high-power mode and the low-power mode (for power conservation) in response to a control signal.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIGS. 2A-2C show circuitry for operating in normal (high power) and static (low power) modes, as may be implemented in accordance with one or more embodiments, in which:

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving the utilization of common and different power domains, as may be implemented for power saving. In certain implementations, aspects of the present disclosure have been shown to be beneficial when used in the context of circuitry and related devices in which low power consumption is beneficial while also addressing issues, such as those noted herein, with regard to circuitry otherwise utilized to facilitate communications in stacked/recycled voltage configurations. While not necessarily so limited, various aspects may be appreciated through the following discussion of non-limiting examples and the corresponding contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments are directed toward energy recycling by operating in stacked and flat modes, using selective circuit stacking to reduce the power consumption. Such approaches can be used to facilitate the support of different applications during operations/dynamic mode, and to support current consumption profiles that are different between low/high power modes such as static and dynamic modes in which a dynamic mode may require current consumption in parts of a system that can completely be switched off during a static or standby mode. Further, the use of a relatively low-voltage power supply can be facilitated by providing high throughput in a flat or overlapping power domain mode, which would otherwise need to be provided using a high-voltage power supply for a stacked mode. This can further facilitate dynamic or other high-throughput operation without necessarily employing circuitry such as level-shifters, thick-oxide main path transistors and complex power delivery circuits for communications between top and bottom domain, which can be more expensive, require more circuit area and increased design time. As such, battery lifetime can be enhanced without suffering from throughput bottlenecks, enhanced voltage headroom can be provided while utilizing relatively low battery voltage, additional stacks (e.g., three or more stacked circuits) can be provided for further charge recycling, system balancing and predictability of charge recycling can be facilitated, configurability based on standby mode requirements can be enhanced, and other stacked operation aspects Embodiments herein may be implemented for a multitude of disparate power supply applications. For example, certain embodiments are directed to implementation with products provided by NXP Semiconductor of Eindhoven, The Netherlands, including the JN518x and NXH2003 products, as may be implemented for healthcare and wearable products. Power supply in these instances may, for example, be provided to facilitate battery operation in dynamic and standby modes. For instance, by operating in a stacked mode during standby operation, a relatively low level battery voltage supply (e.g., 0.9V) can be used to power stacked circuitry in which standby operation is facilitated on voltage ranges of half such a supply (e.g., ~0.4 to 0.45V). Various embodiments are directed to SRAM or other circuits implemented explicitly for carrying out standby operation. These approaches can allow the utilization of circuitry that provides higher functionality, such as CPU and radio functionality, which are highly current consuming during normal operation, while SRAMs and other data-retention elements are utilized for most current consumption during standby. Certain such applications involve the utilization of an SRAM stack divided into two (e.g., equal), or other circuits that split/share control.

As may be implemented with one or more embodiments, an apparatus includes a switching power supply circuit and a control circuit therefor. The switching power supply circuit operates in high and low-power modes. In the high power mode, high and low power rails of a first circuit and of a second circuit are coupled to a power source circuit (e.g. a battery). In the low-power mode, the first circuit is operated in a high power domain and the second circuit is operated in a low power domain using recycled charge from the high power domain.

The control circuit operates the switching circuit in the high-power mode and low-power mode (for power conservation) in response to a control signal. In some implementations, the control circuit adjusts a voltage level of one of the high power mode and the low power mode to suit a particular application. The control circuit may include a clamping circuit that operates with the power supply switching circuit to clamp a voltage level of one of the power rails to a voltage level, prior to switching the one of the power rails to a voltage level that is different than a current voltage level.

The switching power supply circuit operates in a variety of manners, to suit particular applications. In some embodiments, the switching power supply circuit operates the first and second circuits in a common power domain of the high power mode by connecting the high power rails of the first and second circuits to a common high voltage, and connecting the low power rails of the first and second circuits to a common low voltage. As such, each domain may be operated in a "flat" mode with a common voltage. In other embodiments, the switching power supply circuit operates the first and second circuits in overlapping power domains under a high-power mode, in which the high power rails of the first and second circuits are connected across overlapping power domains (e.g., to different high voltages and a common low voltage).

In some embodiments, the switching power supply circuit includes one or more switches that operate to connect respective circuits (and/or power rails therefor) to effect the modes noted herein. On one such embodiment, a first switch circuit is connected to a high voltage input of a first circuit and selectively connects the high voltage input of the first circuit to the high voltage rail for operation in the high-power mode. A second switch circuit is connected to a high voltage input of the first circuit and selectively connects the high voltage input of the first circuit to a higher voltage rail that provides a voltage higher than the high voltage rail for operation in the low-power mode. A third switch circuit is connected to a low voltage output of the first circuit and selectively connects the low voltage output of the first circuit to a reference voltage rail for operation in the high-power mode. A fourth switch circuit is connected to the low voltage output of the first circuit and selectively connects the low voltage output of the first circuit to the high voltage rail for operation in the low-power mode. The high voltage input of the second circuit may be connected to the high voltage rail, with the low voltage output of the second circuit connected to the reference voltage rail, where the second circuit operates between voltage levels provided at the high voltage rail and the reference voltage rail.

In some embodiments, the apparatus includes a mode control circuit that operates with the switching circuit and the control circuit to monitor accesses to the first and second circuit. The mode control circuit provides the control signal for operating the switching power supply circuit in the high-power mode in response to a request for access (e.g. an analogue pull-down or digital signal) to one of the first circuit and the second circuit, and provides the control signal for operating the switching power supply circuit in the low-power mode in a power conservation state. The switching power supply circuit may thus provide high data throughput of the first and second circuits in the high power mode, and lower data throughput of the first and second circuits in the low power mode. In some embodiments, the mode control circuit provides a control signal for operating the switching power supply circuit in the low-power mode in response to a lack of access requests for one of the first circuit and the second circuit over a predefined time period. In certain embodiments, the mode control circuit provides the control signal for operating the switching power supply circuit in the low-power mode in response to entering a sleep mode, and provides the control signal for operating the switching power supply circuit in the high-power mode in response to exiting the sleep mode. In certain embodiments, the mode control circuit provides the control signal based on information including one or more of: a battery voltage level for a battery providing power to the power source circuit, a clock characteristic of a clock upon which information processing is taking place, power of at least one of the first and second circuits, voltage of at least one of the first and second circuits, temperature of at least one of the first and second circuits, and a combination thereof.

Figure 1:
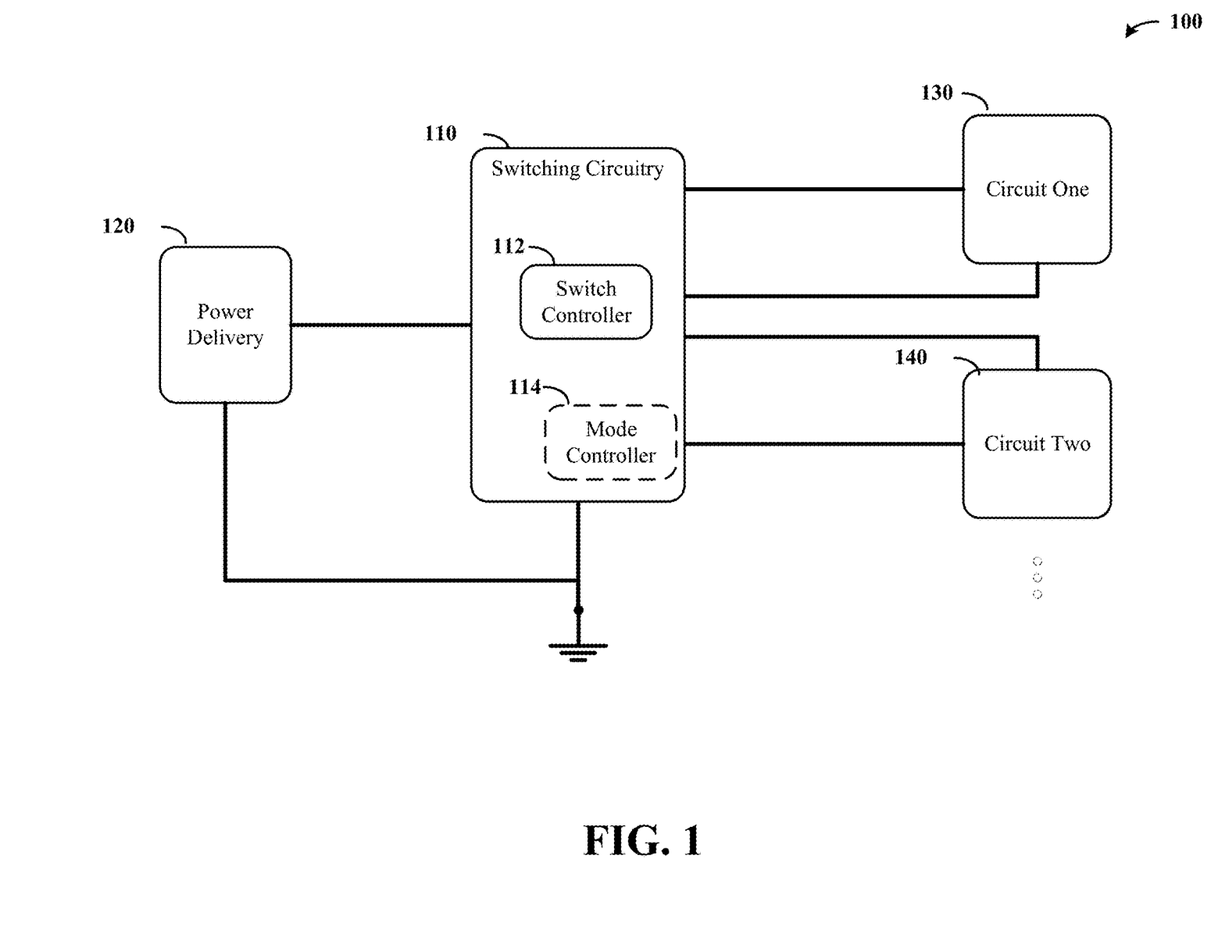
FIG. 1 is a power switching apparatus as may be implemented in accordance with embodiments of the present disclosure.

Turning now to the figures, FIG. 1 shows a power switching apparatus 100 as may be implemented in accordance with one or more embodiments. The apparatus 100 includes a switching power supply circuit 110 operable for switching power from a power delivery circuit 120 (e.g., a battery and/or coupled thereto) to two or more circuits 130 and 140 that operate using high and low power rails (or voltage nodes/ports). A controller circuit 112 such as a state machine controls operation of the switching power supply circuit 110 in respective modes for providing power savings, including a stacked mode in which charge is recycled between the respective two or more circuits 130 and 140.

In a particular implementation, the controller circuit 112 operates to respond to a control signal by operating the switching power supply circuit 110 in high and low power modes as follows. In the high-power mode, the switching power supply circuit 110 connects high and low power rails of the first circuit 130 and of the second circuit 140 to the power delivery circuit 120. In the low power mode, the switching power supply circuit 110 operates the first circuit in a high power domain and operates the second circuit in a lower power domain using recycled charge from the high power domain, by connecting the low power rail of the first circuit to the high power rail of the second circuit. This high and low power domain may operate across voltage levels that are the same as, or different than, respective voltage levels provided in the high-power mode.

In certain implementations, the apparatus 100 includes a mode controller circuit 114 that is responsive to one or more conditions to set the operation of the controller circuit 112. The mode controller circuit 114 may provide the control signal for operating in the high and low power modes, such as by monitoring an analogue circuit for pull up/pull down, monitoring a communication channel, or responding to a digital input.

Figure 2A:
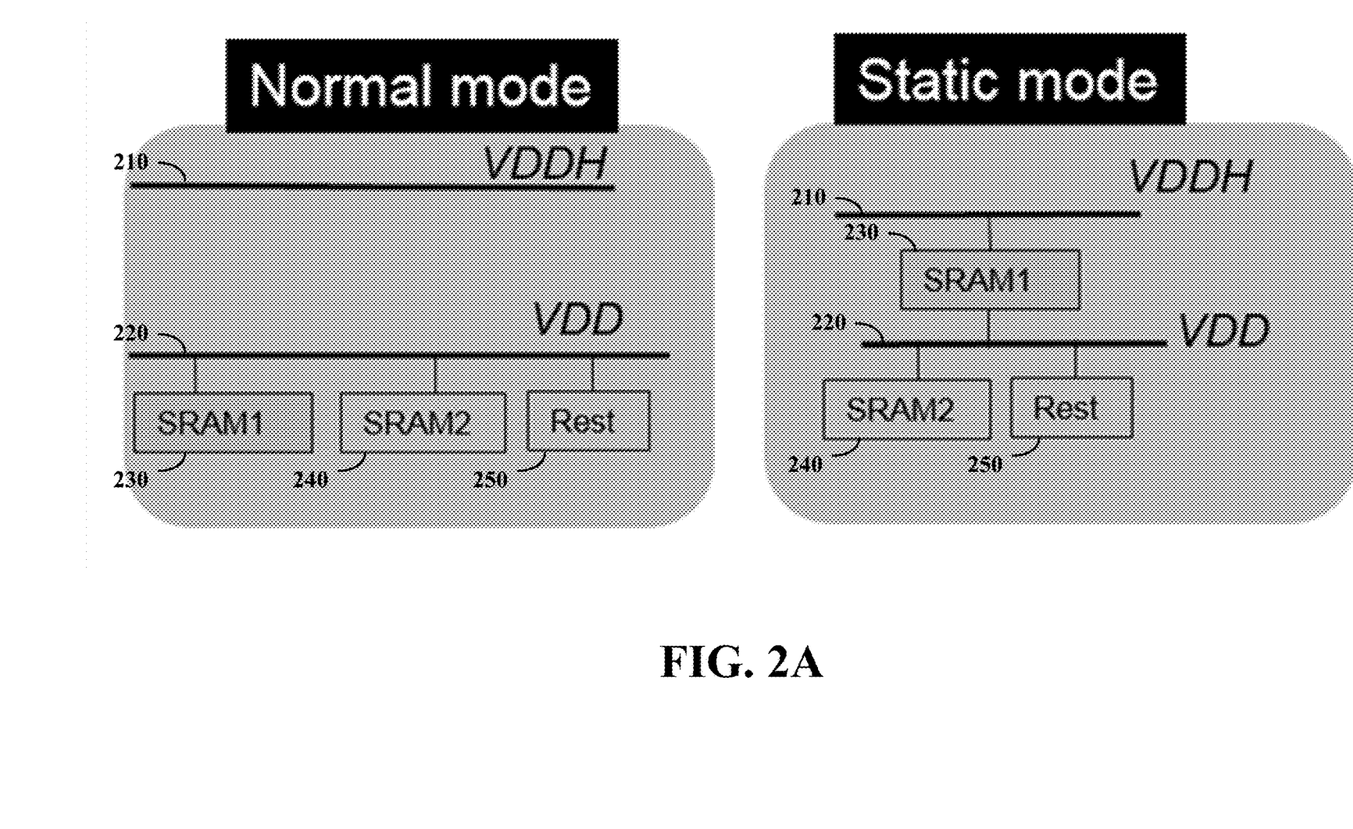
FIG. 2A shows respective circuit components connected to one or both of a high (VDDH) power rail and lower power rail 220 (VDD)
Figure 2B:
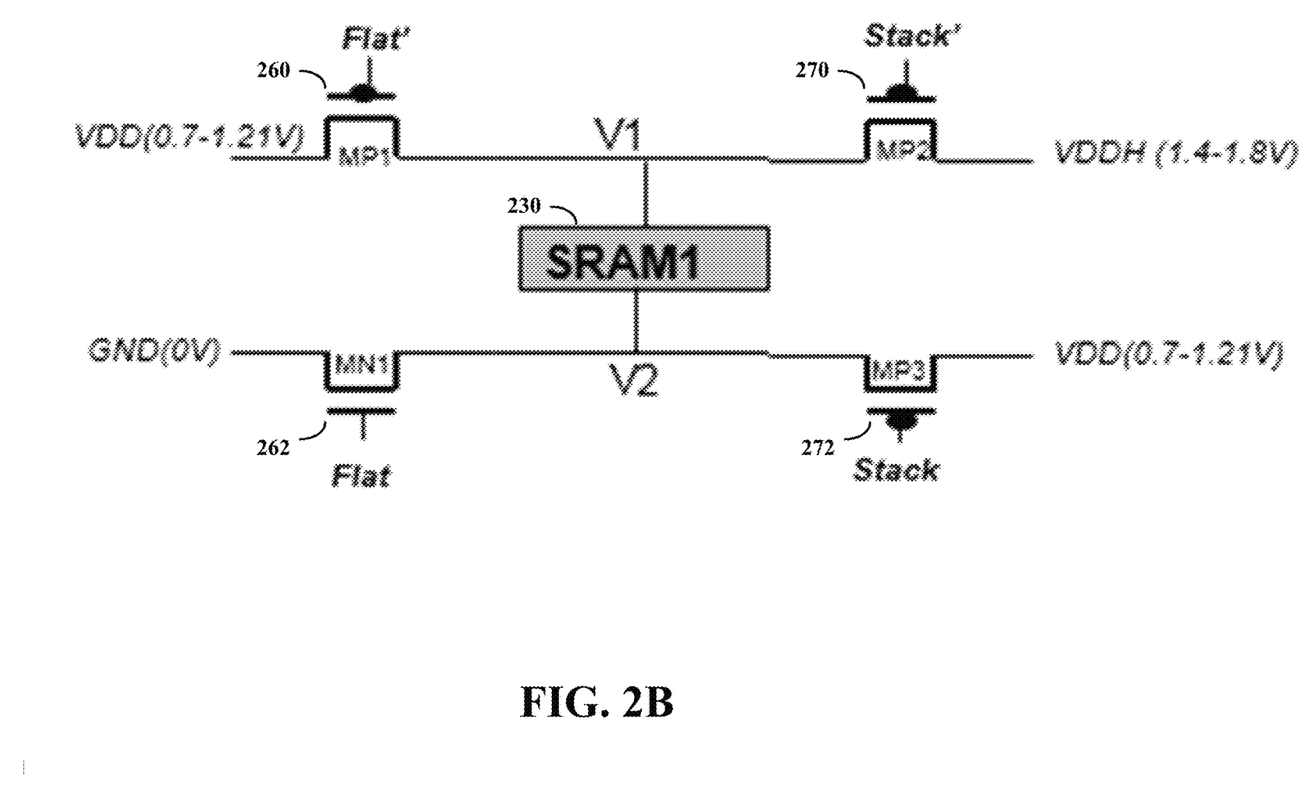
FIG. 2B shows a power rail connection effected with switches.
Figure 2C:
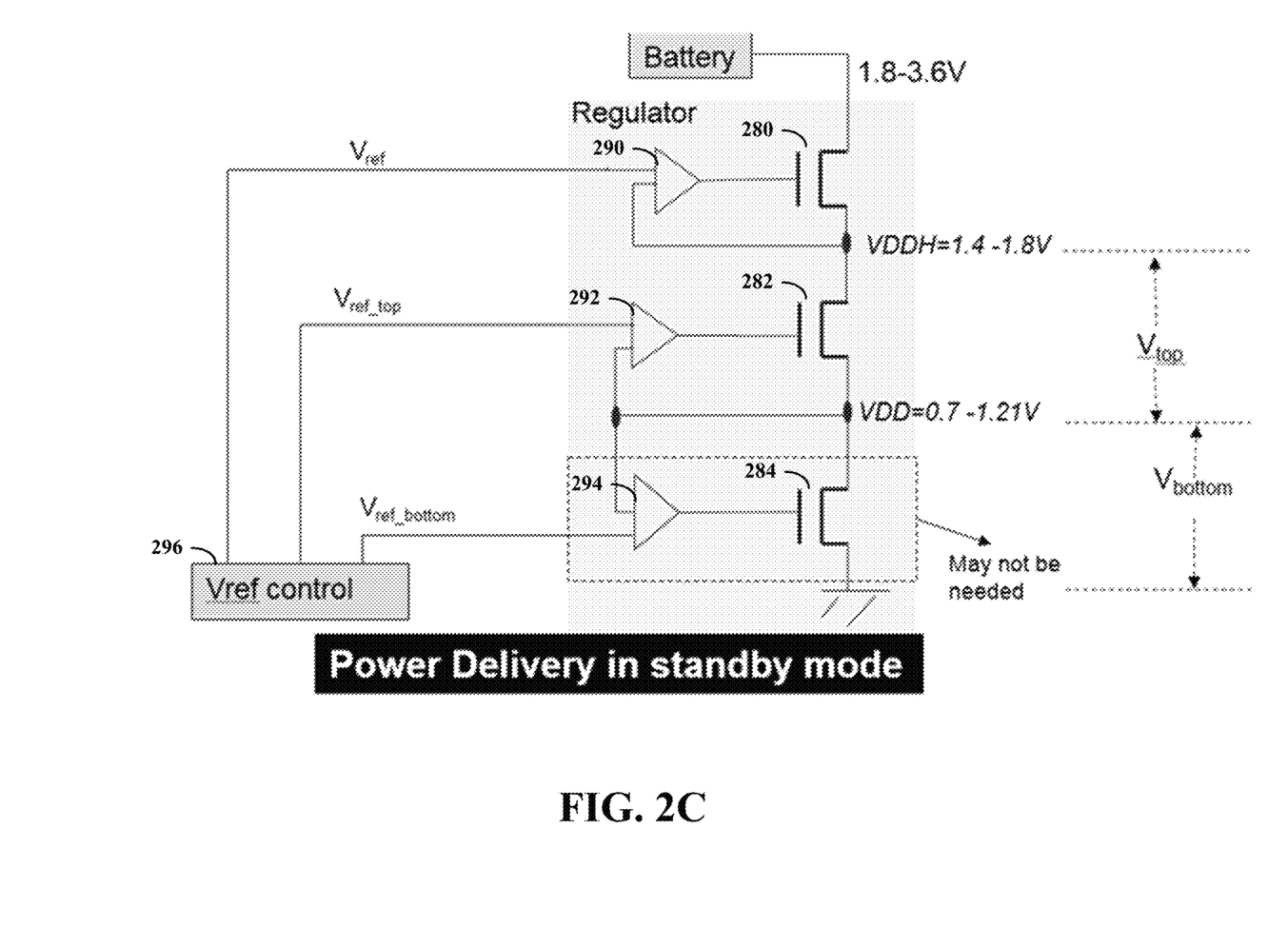
FIG. 2C shows a power delivery approach for standby mode.

FIGS. 2A-2C show circuitry for operating in normal (high power) and static (low power) modes, as may be implemented in accordance with one or more embodiments.

Beginning with FIG. 2A, respective circuit components are shown connected to one or both of a high 210 (VDDH) power rail and lower power rail 220 (VDD). By way of example, two SRAM-based circuits 230 and 240 are shown along with a remaining set of circuits 250. In a normal/flat mode, the circuits are connected between the lower power rail 220 and ground. In a standby mode, circuits 230 and 240 (e.g., SRAM circuits) are stacked, with circuit 230 operating between voltage levels at 210 and 220, and circuit 240 operating using recycled voltage from circuit 230 between power rail 220 and ground (circuits 250 may, for example, be turned off/inoperable in the standby mode). This approach can be implemented with the circuits 230 and 240 each making up about half of an SRAM-type circuit for a system. Further, while the static/stacked mode is shown with circuit 230 between the "higher" voltage 210 and voltage at 220, VDDH in the static/stacked mode can be implemented at VDD and common to VDD (220) in the normal/flat mode and halved between each of circuits 230 and 240.

Referring to FIG. 2B, the power rail connection of circuit 230 is shown effected with switches 260/262 (Flat'/Flat) and 270/272 (Stack'/Stack), which can be reconfigured during different system configurations. In a flat mode, switches 260 and 262 are closed with switches 270/272 open, connecting the circuit 230 between VDD and reference/ground. In a stacked mode, switches 270/272 are closed with switches 260/262 open, connecting the circuit 230 between a high voltage VDDH and VDD. By way of example, VDDH is shown as 1.4-1.8V, VDD is shown at 0.7-1.21V, and reference/ground is shown at 0V.

In various embodiments, the power switches in FIG. 2B are implemented as transistors in a GO1 (thin oxide logic) by using digital control logic signals with the following voltage rails (Flat: 0-VDD; Flat': 0-VDDH; Stack: 0-VDD; Stack': VDD-VDDH). While some of the control signals may be beyond the nominal rail values (0-VDD), the power switches may be based on GO1 by sequencing control signals such that no transistor is exposed to more than nominal rails across its terminals. This can be effected using, for example, a state machine.

FIG. 2C shows a power delivery approach for standby mode, which may implement approaches as shown in FIG. 2A and/or FIG. 2B, in accordance with one or more embodiments. Transistors 280, 282 and 284 are respectively connected to regulator components 290, 292 and 294 that are operated by a controller 296 for providing VDDH, VDD and reference/ground as shown. These three can be provided at 210 and 220 as shown in FIG. 2A, noting that 284/294 can be omitted for certain embodiments. The approach shown in FIG. 2C may, for example be implemented with the JN518x product as discussed herein, in which the power delivery is based on the scheme of FIG. 2B to provide 0.99-1.21V during dynamic mode operation and 0.7V during standby.

Figure 3:
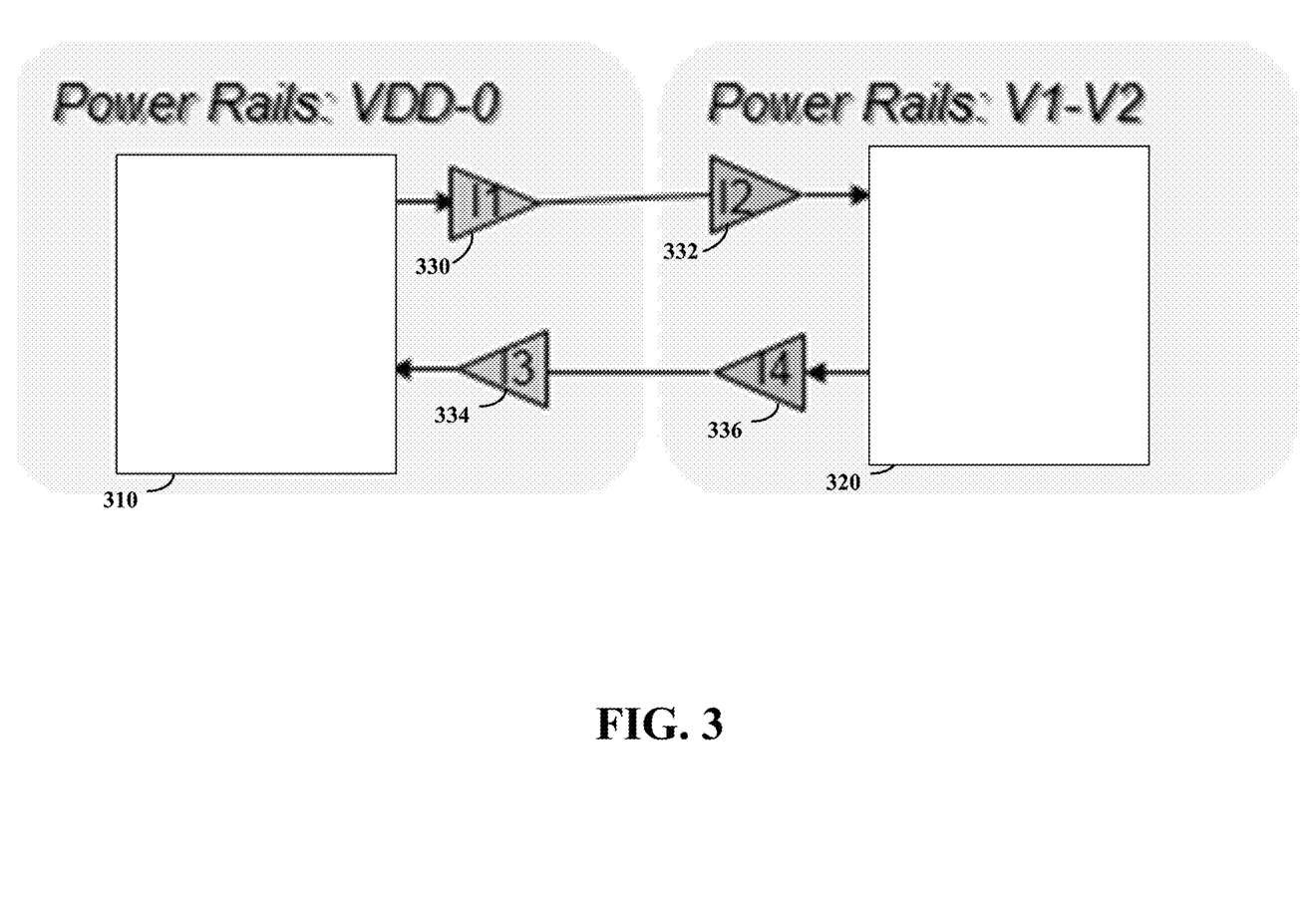
FIG. 3 shows a two-stage clamping scheme, as may be implemented in accordance with embodiments of the present disclosure.

In various embodiments, the input and output of the circuits 230 and 240 are clamped before switching between modes, to mitigate unwanted switching (e.g., glitching as well as false zero or one). A two-stage clamping scheme can be utilized to clamp respective circuit portions 310 and 320 as shown in FIG. 3, using clamp cells 330, 332, 334 and 336 (I1, I2, I3, I4). Such an approach may, for example, be implemented to selectively couple circuits 240 and 250 of FIG. 2A with portion 310, and circuit 230 with portion 320. The clamps may be implemented in GO1 based transistors.

Figure 4:
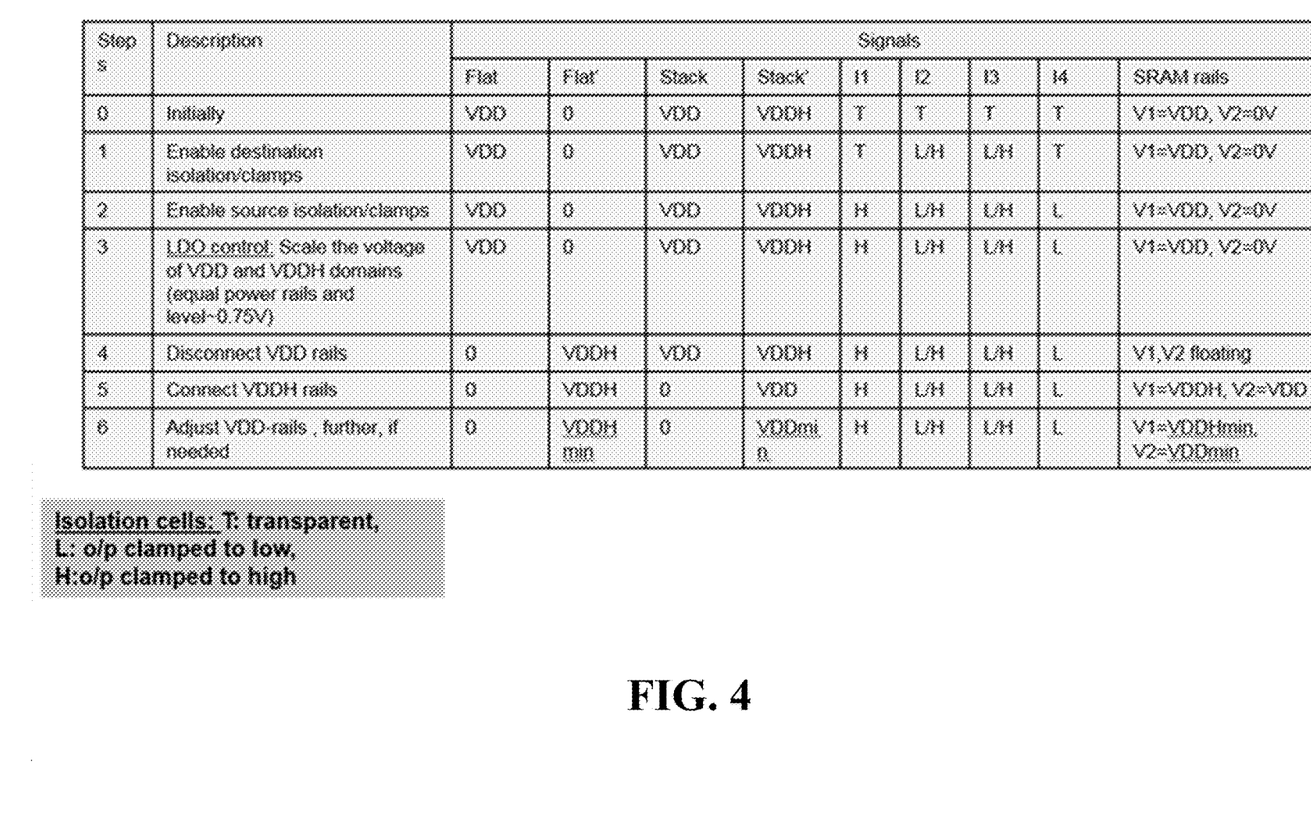
FIG. 4 shows exemplary operational steps, as may be implemented in accordance with one or more embodiments.
Figure 5:
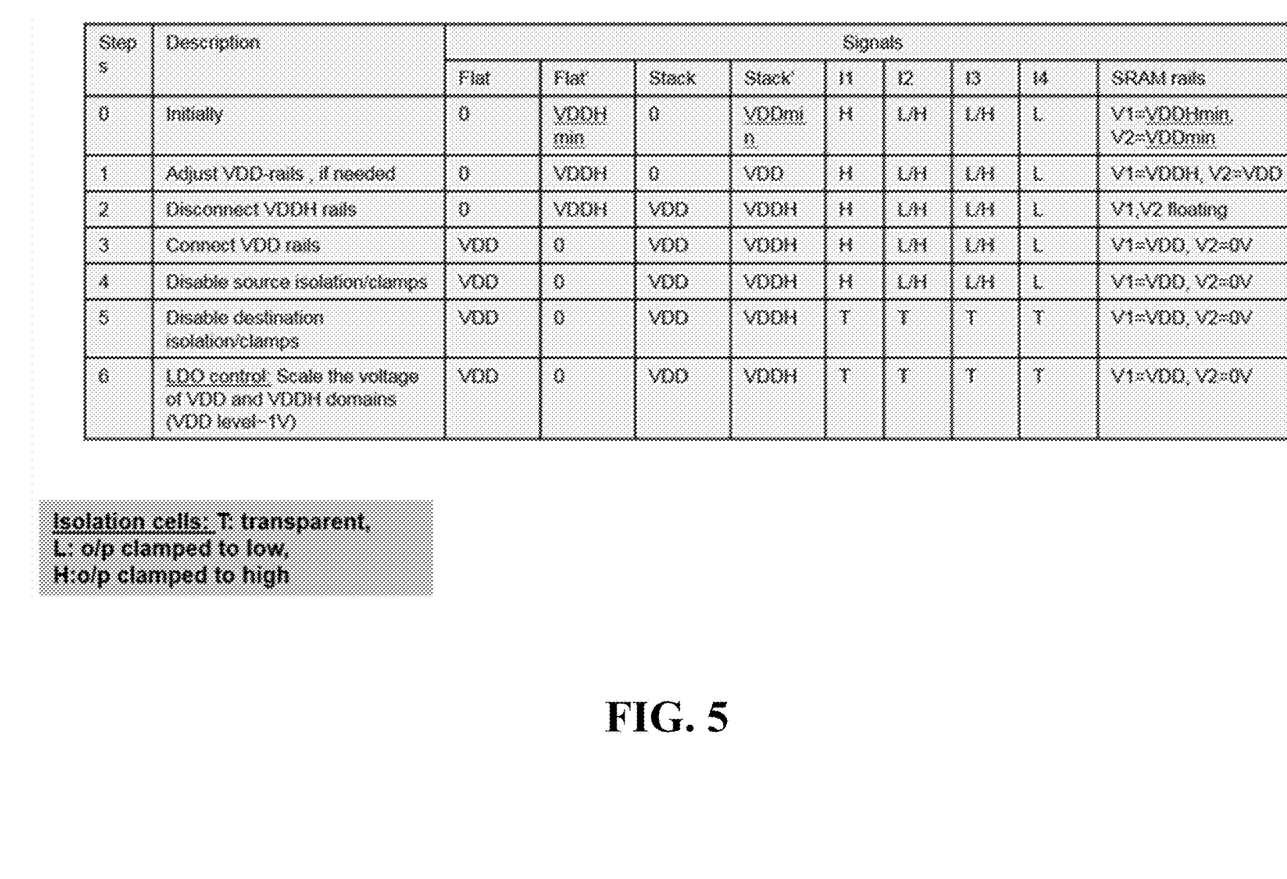
FIG. 5 shows exemplary operational steps, as may be implemented in accordance with one or more embodiments.

The circuitry shown in FIG. 3 may be operated in a variety of manners, to suit particular implementations. Exemplary operational steps that may be implemented with FIG. 3 are shown in tables of FIGS. 4 and 5. These steps may, for example, be utilized with the circuitry and related operation as shown in FIG. 2B, with switches 260/262 (Flat'/Flat) and 270/272 (Stack'/Stack) utilizing clamp cells to clamp low/high voltage as shown. Beginning with FIG. 4, isolation cells are initially transparent (denoted as T) for placing SRAM (e.g., 230 in FIG. 2A) rails as shown. At step 1, destination isolation/clamps are enabled, followed by enabling source isolation/clamps in step 2. At step 3, voltage of VDD and VDDH are scaled (e.g., using a low drop out regulator), after which the VDD rails are disconnected at step 4 (floating V2). At step 5, VDDH rails are connected such that the voltage across the circuit (e.g., 230) is VDDH-VDD. A further adjustment may be made at step 6. A reverse type process is shown in steps 0-6 of FIG. 5.

In some implementations, an input on circuit 320 is clamped to a low level before going to standby mode as follows. The clamp cell 332 (I2) is clamped low (0V), and clamp cell 330 (I1) is clamped high (VDD). At this stage, voltage rails of circuit 320 are changed, and the clamp cell 332 remains low (V2). This can be seen in the state-sequencing protocol table of FIG. 4, and reverse steps can be followed from FIG. 5. A two-stage clamping approach can be implemented to limit exposure to no more than nominal rail voltage. For three-level stacking, a three-stage clamping approach can be used, and so-on. For low voltage products, standby mode voltage can be reduced to facilitate two-level stacking with lower voltage.

Various embodiments are directed to an adaptive control approach for charge recycling, as may be implemented with one or more embodiments. Such approaches may, for example, be implemented with embodiments involving charge recycling as discussed herein, such as those shown in FIGS. 1-5. These embodiments may address issues related to providing desirable operational conditions such as those relating to voltage and operating frequency, and may facilitate adaptive control of such aspects (e.g., for optimizing certain conditions).

Figure 6:
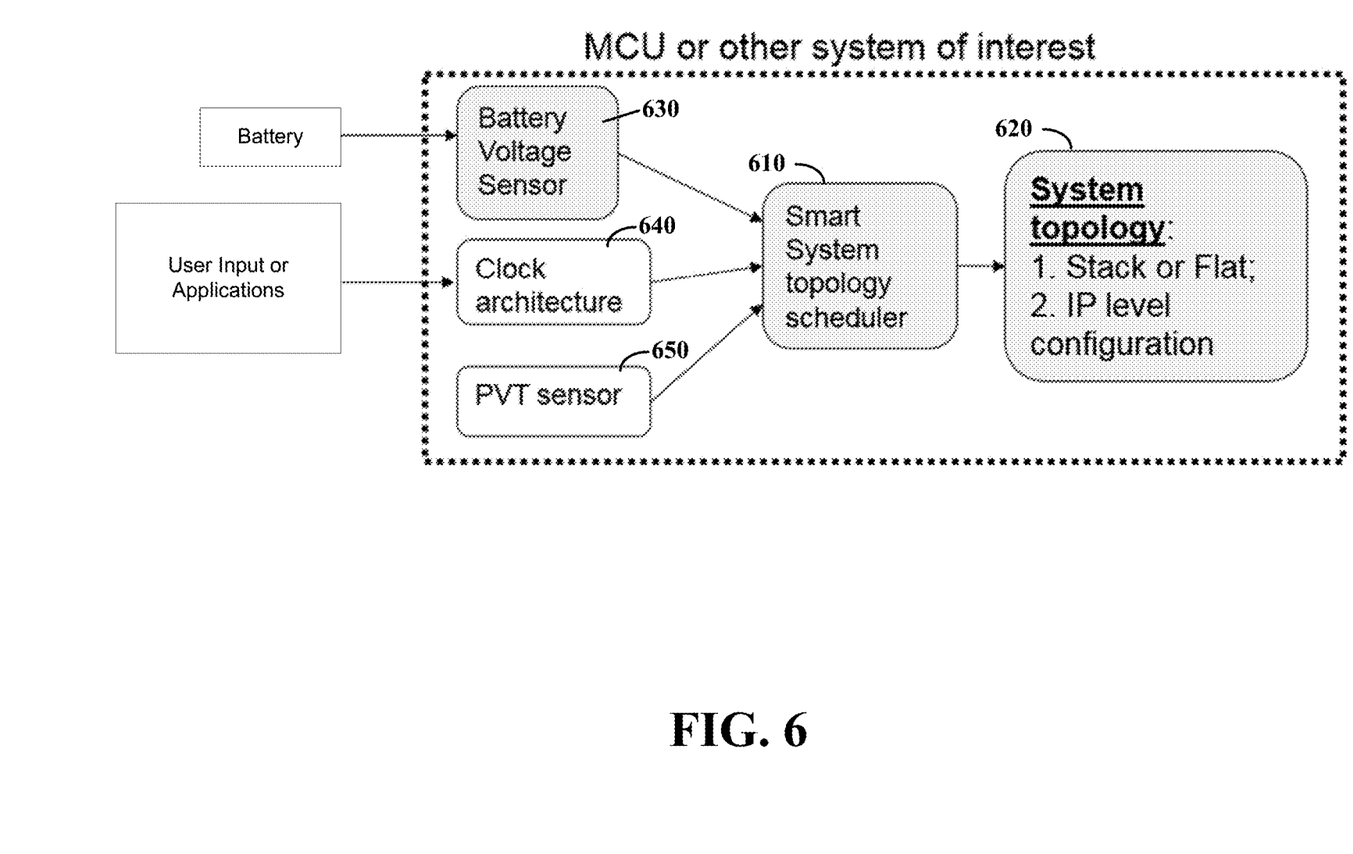
FIG. 6 shows an adaptive control approach, as may be implemented in accordance with one or more embodiments.

FIG. 6 shows an adaptive control approach, as may be implemented in accordance with one or more embodiments. A topology scheduler 610 determines and asserts whether the system should be in stack or flat mode and what IP level configuration should be provided, as shown at 620. The topology scheduler 610 is coupled to receive information from one or more of a battery voltage sensor 630 (for a battery as shown), from clock architecture 640 (which may receive user or application input), and from a PVT (power, voltage and temperature) sensor 650. The battery voltage sensor 630 is used to determine the battery voltage level, which can help in determining an available voltage budget for system stacking. The clock architecture 640 can be used to ascertain a clock frequency requirement of an application, which internally can be derived from the on-chip clock frequency units. This helps in determining what throughput allows tolerating the level-shifter delays. Information from the PVT sensor 650 can be used to adjust system topology. In some implementations, this information from the PVT is used for fine tuning a decision made based on a coarse tuning determined via the battery voltage sensor 630 and clock architecture 640. Other inputs can be used for particular embodiments.

In some implementations, the topology scheduler 610 operates as follows. If in stack mode, the topology scheduler determines how much stacking can be deployed and for which modules, and for which IPs and/or subsystems in which part of stacks (e.g., in top or bottom domain) for which they are deployed. The smart scheduler may track the present topology and determine whether to change system topology based on current and future real-time requirements in an application. Such an approach may utilize additional inputs from a user, allowing the user to disable topology changes if application requirements do not allow them. In various implementations, the topology scheduler 610 utilizes a look-up-table (LUT) for the possible system topologies and selects data in the LUT utilizing one of more of its inputs.

Terms that indicate orientation, such as upper/lower, left/right, top/bottom and above/below, may be used herein to refer to relative positions of elements as shown in the figures. It should be understood that when the terminology is used for notational convenience, the disclosed structures may be oriented different from the orientation shown in the figures.

The specification describes and/or illustrates aspects useful for implementing the claimed invention(s) by way of various circuits or circuitry, which may be discussed using terms such as blocks, modules, device, system, unit, controller, comparator, and other circuit-type depictions. Such circuits or circuitry are discussed in connection with other elements to explain how certain embodiments may be carried out. For example, in certain of the above-discussed embodiments, one or more illustrated items in this context represent circuits (e.g., discrete analog or logic circuitry or (semi-)programmable circuits) configured and arranged for implementing disclosed operations/activities, as may be carried out in the approaches shown in the figures.

Based upon the above discussion and illustrations, those skilled in the art will readily recognize that various modifications and changes may be made to the various embodiments without strictly following the exemplary embodiments and applications illustrated and described herein. For example, methods as described in connection with the figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus comprising:
    a switching power supply circuit configured and arranged to:
        operate in a high-power mode by connecting high and low power rails of a first circuit to a power source circuit, and by connecting high and low power rails of a second circuit to the power source circuit, and
        operate in a low-power mode in which the first circuit is operated in a high power domain and in which the second circuit is operated in a low power domain using recycled charge from the high power domain, by connecting the low power rail of the first circuit to the high power rail of the second circuit;
    a control circuit configured and arranged to respond to a control signal by switching the switching circuit between the high-power mode and the low-power mode for power conservation; and
    a mode control circuit configured and arranged with the switching circuit and the control circuit to monitor accesses to the first and second circuit, and to change the control signal in response to detecting whether there has been a request for access of at least one of the first or second circuits.

2. The apparatus of claim 1, wherein the switching power supply circuit is configured and arranged to, in the high-power mode, operate the first and second circuits in a common power domain by connecting the high power rails of the first and second circuits to a common high voltage, and connecting the low power rails of the first and second circuits to a common low voltage.

3. The apparatus of claim 1, wherein the switching power supply circuit is configured and arranged to, in the high-power mode, operate the first and second circuits in overlapping power domains by connecting the high power rails of the first and second circuits to different high voltages, and connecting the low power rails of the first and second circuits to a common low voltage.

4. The apparatus of claim 1, wherein the mode control circuit is further configured and arranged with the switching circuit and the control circuit to:
    provide the control signal for operating the switching power supply circuit in the high-power mode in response to a request for access to one of the first circuit and the second circuit; and provide the control signal for operating the switching power supply circuit in the low-power mode in a power conservation state.

5. The apparatus of claim 4, wherein the switching power supply circuit is configured and arranged to provide high data throughput of the first and second circuits in the high power mode, and to provide lower data throughput of the first and second circuits in the low power mode.

6. The apparatus of claim 4, wherein the mode control circuit is configured and arranged to provide the control signal for operating the switching power supply circuit in the low-power mode in response to a lack of access requests for one of the first circuit and the second circuit over a predefined time period.

7. The apparatus of claim 4, wherein the mode control circuit is configured and arranged to provide the control signal for operating the switching power supply circuit in the low-power mode in response to entering a sleep mode, and to provide the control signal for operating the switching power supply circuit in the high-power mode in response to exiting the sleep mode.

8. The apparatus of claim 4, wherein the request for access includes a digital signal.

9. The apparatus of claim 4, wherein the request for access includes an analog pull-down signal.

10. The apparatus of claim 4, wherein the mode control circuit is configured and arranged to provide the control signal based on information including at least one of: a battery voltage level for a battery providing power to the power source circuit, a clock characteristic of a clock upon which information processing is taking place, power of at least one of the first and second circuits, voltage of at least one of the first and second circuits, temperature of at least one of the first and second circuits, and a combination thereof.

11. The apparatus of claim 1, wherein the switching power supply circuit includes:
a first switch circuit connected to a high voltage input of the first circuit and configured and arranged to selectively connect the high voltage input of the first circuit to a high voltage rail for operation in the high-power mode;
a second switch circuit connected to the high voltage input of the first circuit and configured and arranged to selectively connect the high voltage input of the first circuit to a higher voltage rail that provides a voltage higher than the high voltage rail for operation in the low-power mode;
a third switch circuit connected to a low voltage output of the first circuit and configured and arranged to selectively connect the low voltage output of the first circuit to a reference voltage rail for operation in the high-power mode; and
a fourth switch circuit connected to the low voltage output of the first circuit and configured and arranged to selectively connect the low voltage output of the first circuit to the high voltage rail for operation in the low-power mode.

12. The apparatus of claim 11, wherein the high voltage input of the second circuit is connected to the high voltage rail, the low voltage output of the second circuit is connected to the reference voltage rail, and the second circuit operates between voltage levels provided at the high voltage rail and the reference voltage rail.

13. The apparatus of claim 1, wherein the control circuit is configured and arranged to adjust a voltage level of one of the high power mode and the low power mode to suit a particular application.

14. The apparatus of claim 1, wherein the control circuit includes a clamping circuit configured and arranged with the power supply switching circuit to clamp a voltage level of one of the power rails to a voltage level, prior to switching the one of the power rails to a voltage level that is different than a current voltage level.

15. A method comprising:
operating a switching power supply circuit in a high-power mode by connecting high and low power rails of a first circuit to a power source circuit, and by connecting high and low power rails of a second circuit to the power source circuit, and
operating the switching power supply circuit in a low-power mode in which the first circuit is operated in a high power domain and in which the second circuit is operated in a low power domain using recycled charge from the high power domain, by connecting the low power rail of the first circuit to the high power rail of the second circuit;
detecting whether there has been a request for access to at least one of the first circuit and the second circuit and in response to changing a control signal; and
in response to the control signal, switching the switching circuit between the high-power mode and the low-power mode for power conservation.

16. The method of claim 15, further including:
monitoring accesses to the first and second circuit,
providing the control signal for operating the switching power supply circuit in the high-power mode for high data throughput in response to a request for access to one of the first circuit and the second circuit; and
providing the control signal for operating the switching power supply circuit in the low-power mode for low data throughput in a power conservation state.

17. The method of claim 16, wherein the monitoring includes monitoring at least one of: a battery voltage level for a battery providing power to the power source circuit, a clock characteristic of a clock upon which information processing is taking place, power of at least one of the first and second circuits, voltage of at least one of the first and second circuits, temperature of at least one of the first and second circuits, and a combination thereof.

18. The method of claim 15, wherein operating the switching power supply circuit in the high power mode includes operating the first and second circuits in a common power domain by connecting the high power rails of the first and second circuits to a common high voltage, and connecting the low power rails of the first and second circuits to a common low voltage.

19. The method of claim 15, wherein operating the switching power supply circuit in the high power mode includes operating the first and second circuits in overlapping power domains by connecting the high power rails of the first and second circuits to different high voltages, and connecting the low power rails of the first and second circuits to a common low voltage.

20. The method of claim 15, wherein switching the switching circuit from the high-power mode to the low-power mode includes:
disconnecting a high voltage input of the first circuit from a high voltage rail and connecting the high voltage input of the first circuit to a higher voltage rail that provides a voltage higher than the high voltage rail for operation in the low-power mode; and disconnecting a low voltage output of the first circuit from a reference voltage rail and connecting the low voltage output of the first circuit to the high voltage rail.

* * * * *